United States Patent
Sang et al.

(10) Patent No.: US 7,701,367 B2
(45) Date of Patent: Apr. 20, 2010

(54) DIGITAL SIGNAL DECODING METHOD

(75) Inventors: Sheng-Jie Sang, Shenzhen (CN); Liang-Yan Dai, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 5 days.

(21) Appl. No.: 12/248,904

(22) Filed: Oct. 10, 2008

(65) Prior Publication Data

US 2010/0026534 A1 Feb. 4, 2010

(30) Foreign Application Priority Data

Jul. 30, 2008 (CN) .................... 2008 1 0303202

(51) Int. Cl.
*H03M 5/08* (2006.01)

(52) U.S. Cl. .......................... 341/53; 341/51

(58) Field of Classification Search .............. 341/51, 341/53; 382/232, 233, 238, 218, 219; 375/240.02; 348/402

See application file for complete search history.

(56) References Cited

U.S. PATENT DOCUMENTS 7,227,998 B2 * 6/2007 Nakayama et al. .......... 382/232

* cited by examiner

*Primary Examiner*—Rexford N Barnie
*Assistant Examiner*—Joseph Lauture
(74) *Attorney, Agent, or Firm*—Zhigang Ma

(57) ABSTRACT

A computer-implemented method to decode a digital signal includes following steps. A micro control unit (MCU) receives a digital signal. The MCU reads a low voltage period of the digital signal and stores a time duration of the low voltage period into a first register as a value TL. The MCU reads next high voltage period of the digital signal and stores a time duration of the high voltage period into a second register as a value TH. The MCU reads the value TL of the first register and the value TH of the second register, and computes a ratio TR=TH/TL. The MCU compares the ratio TR with two predetermined values M and N, if TR=M, the decoded result is a logical "1." If TR=N, the decoded result is a logical "0."

6 Claims, 3 Drawing Sheets

DIGITAL SIGNAL DECODING METHOD

BACKGROUND

1. Field of the Disclosure

The present disclosure relates to decoding methods, and particularly to a decoding method to decode a digital signal.

2. Description of Related Art

Referring to FIG. 3, two coordinate digital signals to be decoded by a typical digital signal decoding method is shown. According to this typical digital signal decoding method, after a semi-period (such as 0.56 ms in one example) low voltage, the digital signal reaches a rising edge, a voltage of a time point (such as 0.84 ms in one example) which is between a semi-period and a period after the rising edge is collected. If the collected voltage is at the high level (shown at a broken line of the upper schematic view), the digital signal is decoded as logical "1." If the collected voltage is at the low level (shown at a broken line of the lower schematic view), the digital signal is decoded as logical "0." However, if the frequency of the digital signal is unstable, the decoded logical codes maybe not correct.

What is needed is to provide a digital signal decoding method which can correctly decode a digital signal even the frequency of the digital signal is unstable.

DETAILED DESCRIPTION

Figure 1:
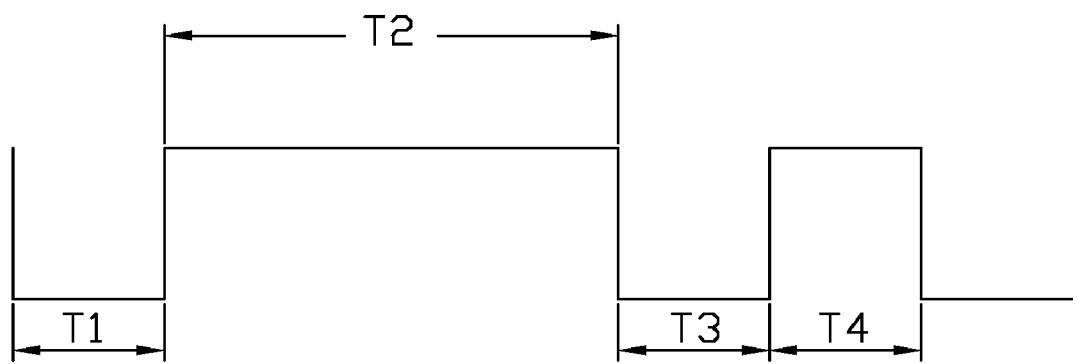
FIG. 1 is a schematic view of a digital signal to be decoded by an exemplary embodiment of a digital signal decoding method of the present disclosure.
Figure 2:
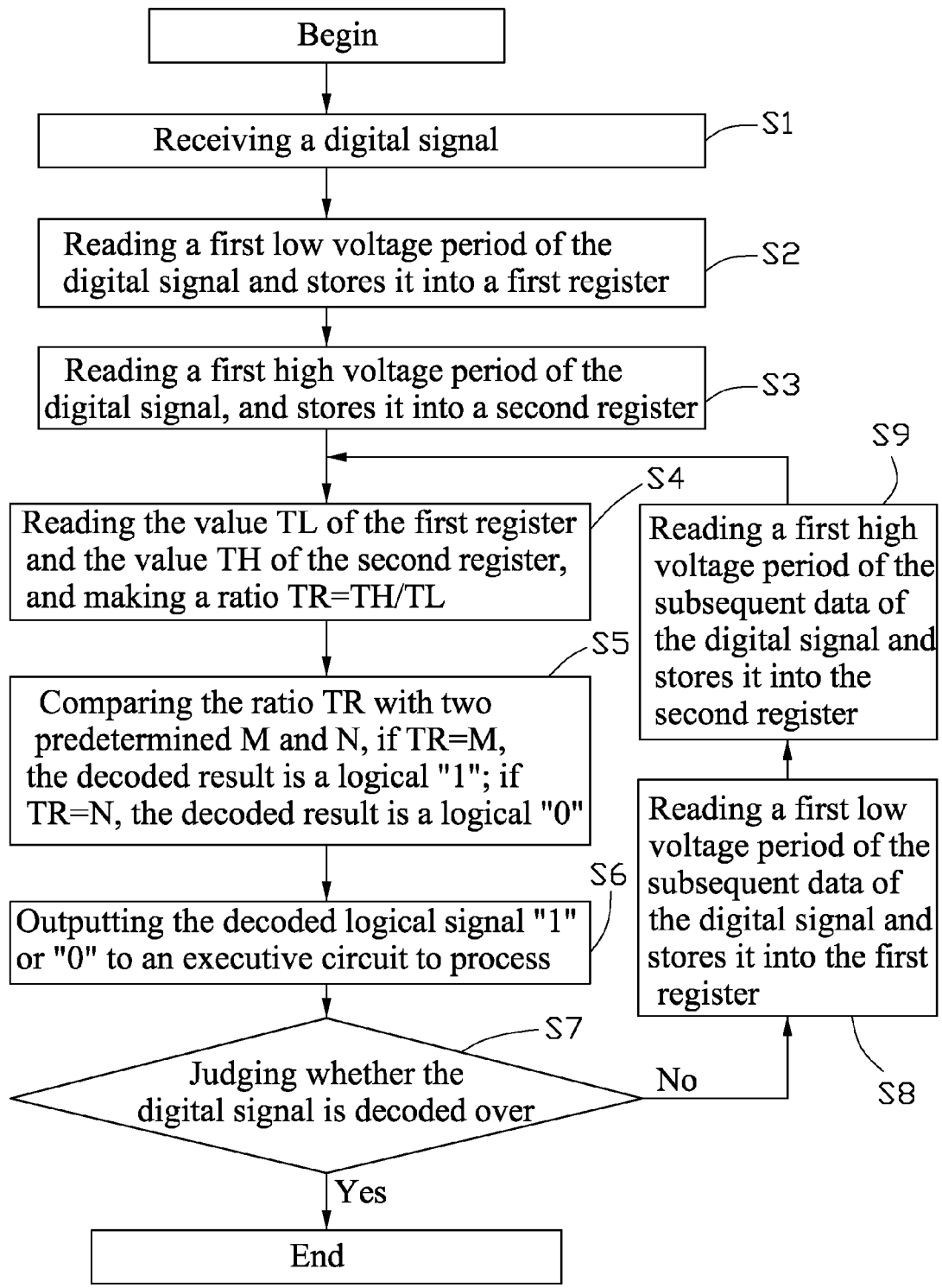
FIG. 2 is a flowchart of one embodiment of the digital signal decoding method of FIG. 1.
Figure 3:
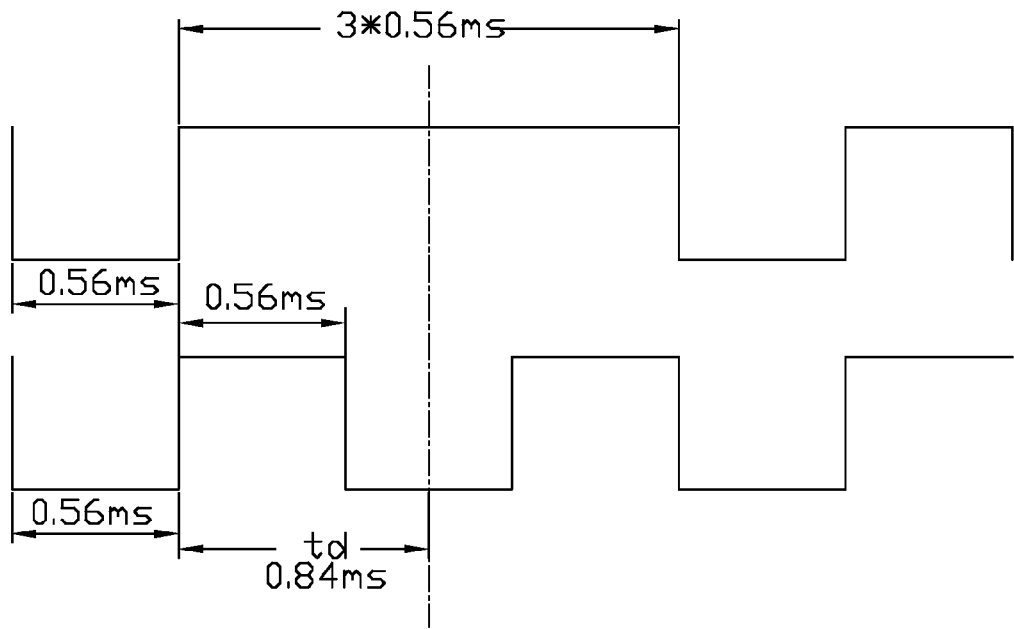
FIG. 3 are two coordinate digital signal schematic views to be decoded by a typical digital signal decoding method.

An exemplary embodiment of a digital signal decoding method to decode a digital signal as shown in FIG. 1 is illustrated. The digital signal may correspond to a logical "1" and a logical "0" following a semi-period of high and low voltage levels respectively. Furthermore, the digital signal may be encoded such that the logical "1" is formed as a semi-period low voltage followed by an M multiple of the semi-period high voltage (See T1 and T2 period in FIG. 1). Accordingly, the logical "0" is formed as a semi-period low voltage followed by an N multiple of semi-period high voltage (See T3 and T4 period in FIG. 1). The values M and N are predeterminedly different and are saved in a micro control unit (MCU). The predetermined values M and N each are not less than one, and in this embodiment, M=3, and N=1, namely T2/T1=M=3, and T4/T3=N=1. However, it may be understood that these values are exemplary and may differ depending on the embodiment.

The digital signal decoding method includes the following steps.

In step S1, the MCU receives a digital signal to be decoded.

In step S2, the MCU reads a first low voltage period of the digital signal, and stores a time duration of the first low voltage period into a first register as a value TL.

In step S3, the MCU reads a first high voltage period of the digital signal, and stores a time duration of the first high voltage period into a second register as a value TH.

In step S4, the MCU reads the value TL of the first register and the value TH of the second register, and computes a ratio TR=TH/TL.

In step S5, the MCU compares the ratio TR with the predetermined values M and N, if TR=M, the decoded result is a logical "1." If TR=N, the decoded result is a logical "0."

In step S6, the MCU outputs the decoded logical signal "1" or "0" to an external executive circuit, such as a remote control television, to process.

In step S7, the MCU determines whether the digital signal has ended. If the digital signal has ended, the decoding process ends.

In step S8, if the digital signal has not ended, the MCU reads a first low voltage period of a subsequent data of the digital signal, and stores a time duration of the first low voltage period of the subsequent data of the digital signal into the first register as a value TL.

In step S9, the MCU reads a first high voltage period of the subsequent data of the digital signal, and stores a time duration of the first high voltage period of the subsequent data of the digital signal into the second register as a value TH, and then goes back to step S4.

Because the ratio relationship of a logic data "1" or "0" between every two adjacent low and high voltage cannot be changed by changing the frequency of the digital signal, thereby the digital signal decoding method can correctly decode the digital signal even when the frequency of the digital signal is unstable.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A computer-implemented method to decode a digital signal, the method comprising:

(a) receiving the digital signal;

(b) reading a first low voltage period of the digital signal, and storing a time duration of the first low voltage period into a first register as a value TL;

(c) reading a first high voltage period of the digital signal, and storing a time duration of the first high voltage period into a second register as a value TH;

(d) reading the value TL of the first register and the value TH of the second register, and computing a ratio TR=TH/TL;

(e) comparing the ratio TR with two predetermined values M and N, wherein the decoded result is a logical "1" if TR=M; and wherein the decoded result is a logical "0" if TR=N;

(f) outputting the decoded logical signal "1" or "0"; and (g) determining whether the digital signal has ended, wherein in response to the digital signal has not been completely decoded, reading a first low voltage period of a subsequent data of the digital signal, and storing a time duration of the first low voltage period of the subsequent data of the digital signal into the first register as a value TL; and reading a first high voltage period of the subsequent data of the digital signal, and storing a time duration of the first high voltage period of the subsequent data of the digital signal into the second register as a value TH, and then going back to step (d).

2. The computer-implemented method of claim 1, wherein the logical "1" is formed as a semi-period low voltage followed by an M multiple of the semi-period high voltage, the logical "0" is formed as a semi-period low voltage followed by an N multiple of semi-period high voltage, the predetermined values of M and N are different from each other, and wherein the predetermined values of M and N are each are not less than one.

3. The computer-implemented method of claim 2, wherein M=3 and N=1.

4. The computer-implemented method of claim 1, wherein the values of M and N are stored in a micro control unit (MCU).

5. The computer-implemented method of claim 1, wherein the logical "1" and the logical "0" are stored in an external executive circuit.

6. The computer-implemented method of claim 5, wherein the executive circuit comprises a remote control television.

* * * * *